United States Patent
Fujii et al.

[11] Patent Number: 5,174,925
[45] Date of Patent: Dec. 29, 1992

[54] CONDUCTIVE INK COMPOSITION AND METHOD OF FORMING A CONDUCTIVE THICK FILM PATTERN

[75] Inventors: Satoru Fujii, Takatsuki; Hirotoshi Watanabe, Osaka, both of Japan

[73] Assignee: Matsushita Electric Industrial Co., Ltd., Osaka, Japan

[21] Appl. No.: 683,183

[22] Filed: Apr. 11, 1991

[30] Foreign Application Priority Data

Apr. 12, 1990 [JP] Japan .................................. 2-97104
Apr. 12, 1990 [JP] Japan .................................. 2-97105

[51] Int. Cl.$^5$ .............................................. H01B 1/06
[52] U.S. Cl. .................................. 252/514; 252/518; 252/519
[58] Field of Search ............... 252/512, 518, 519, 520, 252/514

[56] References Cited

U.S. PATENT DOCUMENTS

| | | | |
|---|---|---|---|
| 4,695,404 | 9/1987 | Kwong | 252/514 |
| 4,865,772 | 9/1989 | Suehro et al. | 252/518 |
| 4,877,555 | 10/1989 | Yuhaku | 252/512 |
| 4,921,623 | 5/1990 | Yamaguchi et al. | 252/512 |
| 4,937,016 | 6/1990 | Suehiro et al. | 252/512 |
| 4,996,005 | 2/1991 | Saito et al. | 252/512 |
| 5,035,837 | 7/1991 | Saeki et al. | 252/518 |

FOREIGN PATENT DOCUMENTS 55-36512 9/1980 Japan .
64-81872 3/1989 Japan .
2-228375 9/1990 Japan .

OTHER PUBLICATIONS

Advanced Hybrid Technology pp. 44–49 (1989).

Primary Examiner—Karl Group
Assistant Examiner—Chris Gallo
Attorney, Agent, or Firm—Wenderoth, Lind & Ponack

[57] ABSTRACT

A method of forming a conductive thick film pattern comprises the steps of filling grooves of an intaglio with a conductive ink, transferring the conductive ink in the grooves onto a blanket of which surface is coated with an elastic material, transferring and printing a conductive thick film pattern transferred on the blanket onto a substrate, firing the conductive pattern to scatter the organic matter, and sintering the conductive pattern. A conductive ink comprises conductive metal powder, glass frit, transition metal oxide, dispersing agent, the vehicle containing an organic binder comprising at least one of poly-iso-butyl methacrylate, poly-iso-propyl methacrylate, polymethyl methacrylate, poly-4-fluoroethylene, and poly$\alpha$-methyl styrene.

8 Claims, 2 Drawing Sheets

CONDUCTIVE INK COMPOSITION AND METHOD OF FORMING A CONDUCTIVE THICK FILM PATTERN

BACKGROUND OF THE INVENTION

1. Field of the Invention

The present invention relates to a method of forming a conductive thick film pattern on a circuit board and a conductive ink used therein.

2. Description of the Prior Art

Hitherto, as the most popular method for forming a thick film pattern on a circuit board, screen printing is known. By varying the screen mesh, possibility of printing pattern width of 30 μm is reported by Ikegami, Goto and Tokumaru in "Patterning Technology in Hybrid Microelectronics," Electronic Materials, May 1989, p. 44, but since wires are broken due to impedance of linearity of pattern and lack owing to the effects of mesh, the limit pattern width is about 100 μm as mass produced industrial products by screen printing.

By contrast, the Japanese Examined Patent Publication No. 55-36512 discloses a thick film printing method by offset printing. Here, the rubber hardness of soft material is 30 degree or less, and it is difficult to reproduce the pattern precisely in the fine-line pattern of 100 μm or smaller pitch.

On the other hand, some of the screen printing pastes commercially available as conductive pastes contain ethyl cellulose resin or acrylic resin in the binders. In the Japanese Un-examined Patent Publication No. 2-228375, an acrylic resin with molecular weight of 50,000 to 500,000 is used in embodiments as organic binder of thick film paste. The viscosity of such ink, however, is too high to be used in offset printing directly. In order to increase the amount of transfer and enhance the printability, the amount of resin may be increased. However, to increase the high molecular weight resin while maintaining the printability, the amount of solvent must be also increased, so that the pigment concentration in ink may be lowered, and the ink density may drop in the thick film. Or only by increasing the content of the resin, the scattering performance worsens, and the binder is not scattered completely while baking, and it may be left over as carbon particles, which may seriously influence the resistance.

SUMMARY OF THE INVENTION

It is hence a primary object of the invention to present a method of forming a conductive thick film pattern for mass-producing conductive thick film pattern products employing offset printing method, in order to obtain fine-line patterns of high quality excellent in linearity of edge and less on occurrence of lack of hiding and cutoff, in particular, fine-line patterns with the pattern width of 100 μm or less.

It is another object of the invention to present a conductive ink suited for such pattern forming method.

To achieve the above objects, a method of forming a conductive thick film pattern of the invention comprises the steps of filling grooves of an intaglio with a conductive ink, transferring the conductive ink in the grooves of the intaglio onto a blanket of which surface is coated with an elastic material mainly composed of a silicone resin, transferring and printing a conductive thick film pattern transferred on the said blanket onto a circuit board, scattering an organic material by baking the transferred conductive thick film pattern, and sintering the transferred conductive thick film pattern.

A conductive ink of the invention comprises conductive metal powder, glass frit, transition metal oxide, dispersing agent, and a vehicle containing an organic binder comprising at least one of poly-iso-butyl methacrylate (i-BMA), poly-iso-propyl methacrylate (i-PMA), polymethyl methacrylate (MMA), polytetrafluoroethylene and poly-αmethylstyrene, or a copolymer of poly-α-methylstyrene (α-MeSt) and poly-iso-butylmethacrylate, or a copolymer of poly-α-methylstyrene, poly-iso-butylmethacrylate and polymethyl methacrylate, or a copolymer of poly-α-methyl styrene and poly-iso-propyl methacrylate, or a copolymer of poly-α-methylstyrene, poly-iso-propylmethacrylate and polymethyl methacrylate. As the conductive metal powder, at least one of copper, gold and silver may be used preferably. The weight-average molecular weight of the organic binder is preferably 100,000 to 1,300. The content of the organic binder is preferably 2 to 15 wt. % to the whole ink.

Considering further the adhesion strength of the thick film pattern to the circuit board, the content of the transition metal oxide in the said ink is desired to be 0.5 to 2.0 wt. % of the whole ink amount, while the content of glass frit should be 3 to 4 wt. % of the whole ink amount. At the same time, considering the adhesion strength of thick film pattern to the circuit board, the desired amount of dispersing agent should be 0.05 to 5.0 wt. % to the whole ink amount. In consideration of the linearity of the printing pattern, the organic solvent amount composing the vehicle should be 0.04 to 0.18 by weight to the whole powder amount.

In the composition mentioned above, the ink suited to offset printing can be prepared, and by offset printing, the high precision pattern may be easily formed on the circuit board, at a higher edge linearity than in the conventional screen printing method, being less in occurrence of lack of hiding and cutoff, and it is also effective because patterns of high quality are obtained from the viewpoint of precision.

DESCRIPTION OF THE PREFERRED EMBODIMENTS

Figure 1:
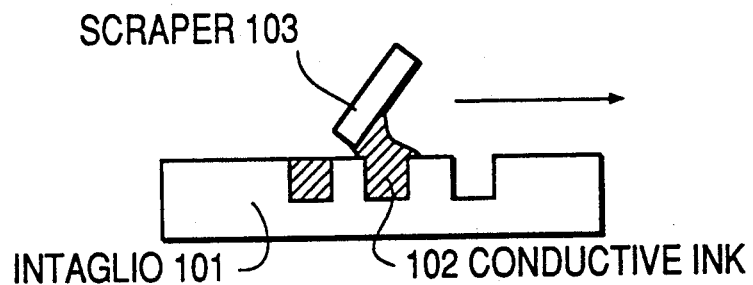
FIG. 1 is a sectional view of filling method of intaglio with ink.

Referring now to the drawings, the forming method of conductive thick film pattern and the conductive ink of the invention are described in detail in one of the embodiments.

FIG. 1 is a sectional view of filling method of intaglio with ink. In FIG. 1, numeral 101 is a intaglio. In the first place, a conductive ink 102 is dropped on the intaglio, and the whole surface of the intaglio is scraped off by scraper 103, and the ink is left over only in the grooves.

Figure 2:
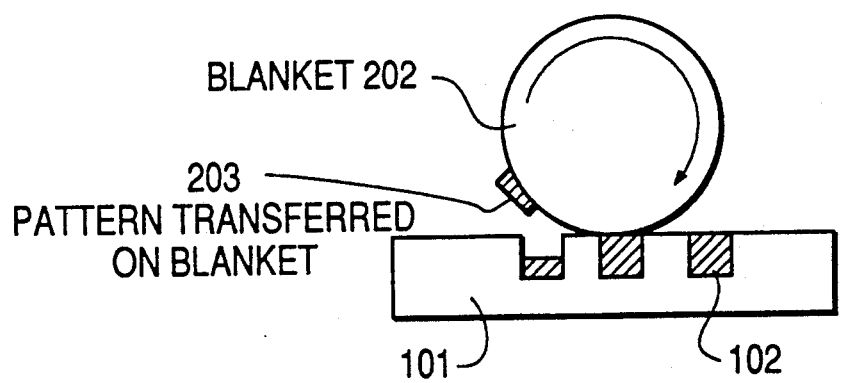
FIG. 2 is a sectional view of pattern transfer method from intaglio to blanket.

FIG. 2 is a sectional view of transfer method of pattern from the intaglio onto a blanket. In FIG. 2, numeral 202 is a blanket of which surface is coated with a rubber-like elastic material excellent in releasability performance. The acceptable blanket is, for example, an elastic material with rubber hardness of 30 to 60 degrees (the hardness quoted in the invention refers always to JIS K 6301, 5-2, type A) mainly composed of silicone resin, among silicone resin, fluoro plastics, polyethylene resin and others, with the surface coated in a thickness of about 5 mm. Numeral 203 is a pattern formed on the blanket by pressing the said blanket 202 onto the intaglio 101.

Figure 3:
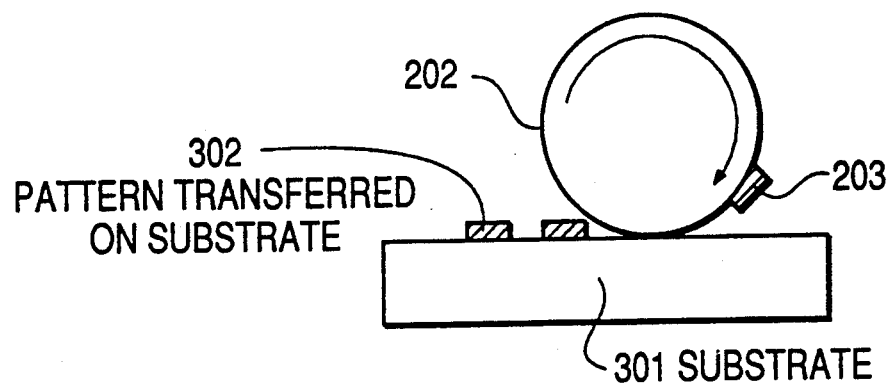
FIG. 3 is a sectional view of a method of pressing and transferring a pattern on blanket onto circuit board.

FIG. 3 is a sectional view of a method of pressing and transferring the pattern on the blanket onto the circuit board. Numeral 302 is a desired pattern obtained by pressing and transferring the pattern from the blanket onto the circuit board. The transfer pressure in the step of transferring the ink in the grooves in the intaglio onto the blanket, and the printing pressure in the step of transferring and printing the conductive thick film pattern transferred on the blanket onto the circuit board are 2 to 6 kg/cm$^2$.

In the steps shown in FIG. 1 through FIG. 3, a desired pattern is formed on the circuit board, and when evaporating and removing the solvent contained in the thick film composition, it is dried for 10 minutes at 100° to 150° C. In succession, the electric furnace is programmed for firing and sintering so that the specified time in the highest temperature part be 10 minutes and that the total firing time be 60 minutes.

In case the conductive metal power is oxidized in the oxidizing atmosphere during baking, it is baked in the non-oxidizing atmospheric step, and the oxygen concentration is 10 ppm or less, and the baking temperature is 850° to 975° C. In baking in the oxidizing atmospheric condition, meanwhile, the baking temperature is 850° to 975° C.

The conductive ink comprises conductive metal powder, glass frit, transition metal oxide, dispersing agent, and vehicle containing organic binder comprising of at least one type of poly-iso-butyl methacrylate, poly-iso-propyl methacrylate, polymethyl methacrylate, poly-4-fluoroethylene and poly-α-methyl styrene. Furthermore, the organic binder may comprise a copolymer of poly-α-methyl styrene and poly-iso-butyl methacrylate, preferably a copolymer composed at a ratio of 5 to 20 wt. % of poly-α-methyl styrene and 80 to 95 wt. % of poly-iso-butyl methacrylate, or a copolymer of poly-α-methyl styrene, poly-iso-butyl methacrylate and polymethyl methacrylate, preferably a copolymer composed at a ratio of 5 to 20 wt. % of poly-α-methyl styrene, 60 to 90 wt. % of poly-iso-butyl methacrylate, and 20 to 25 wt. % of polymethyl methacrylate, or a copolymer of poly-α-methyl styrene and poly-iso-propyl methacrylate, or preferably a copolymer composed at a ratio of 5 to 20 wt. % of poly-α-methyl styrene and 80 to 95 wt. % of poly-iso-propyl methacrylate, or a copolymer composed of poly-α-methyl styrene, poly-iso-propyl methacrylate and polymethyl methacrylate, or preferably a copolymer composed at a ratio of 5 to 20 wt. % of poly-α-methyl styrene, 60 to 90 wt. % of poly-iso-propyl methacrylate and 20 to 25 wt. % of polymethyl methacrylate. As the conductive metal material, it is desired to use at least one of copper, gold and silver.

The transition metal oxide in the ink preferably comprises at least one of zinc oxide, titanium oxide, chromium (III) oxide, cadmium oxide and nickel (II) oxide. The organic solvent composing the vehicle preferably comprises at least one of α-terpineol, n-butyl carbitol, butyl carbitol acetate, 2,2,4-trimethyl-1-3-hydroxypentylisobutylate, 2-butoxy ethanol, and 2-ethoxy ethanol.

The conductive ink may preferably comprise 3 to 13 wt. % of organic solvent of composing the vehicle, 3 to 4 wt. % of glass frit, 0.5 to 2.0 wt. % of transition metal oxide, 0.05 to 5.0 wt. % of dispersant, and 78 to 86 wt. % conductive metal powder. The mean particle size of conductive metal powder is desired to be 0.05 to 3.0 μm.

Further descriptions are made by reference to examples of embodiment.

EXAMPLE 1

Using a three-roll ceramic mill, a copper ink was prepared by passing through the mill base of the following composition six times.

| | |
|---|---|
| Copper (mean particle size 1.0 μm) | 79 (parts by weight) |
| Glass frit (Nippon Electric Glass Co. GA-9) (PbO.B$_2$O$_3$.SiO$_2$) | 3 |
| Zinc oxide (Kanto Chemical Co.) | 1 |
| i-BMA, α-MeSt resin (Sekisui Chemical Inc. IBS-6) Weight-average molecular weight 4750 | 10 |
| Solvent (Kanto Chemical Co., butylcarbitol acetate) | 6.6 |
| Dispersing agent (phosphate of polyoxyethylene alkyl or alkylallyl) | 0.4 |

Using the above copper ink, a pattern was formed on an alumina substrate in a width of 85, 60, 42, 34, 18 μm, and height of 4 μm. The printing method is shown below. The intaglio was prepared by etching the pattern of width of 100, 75, 50, 40, 30 μm and depth of 13.5 μm in glass, and the copper ink was dropped on the intaglio, and the whole surface of the intaglio was scraped off by a ceramic scraper, thereby leaving the copper ink only in the grooves of the intaglio, and the blanket having the surface coated with 5 mm thick silicone rubber (JIS K 6301, K-2, type A rubber hardness 35 degrees) was pressed tightly and rotated to transfer the pattern on the blanket. The blanket having the pattern formed on was pressed to the object of transferred, and the pattern was transferred onto the object. The obtained pattern was excellent in linearity, and was of high quality being free from lack of hiding or cutoff.

When the hardness of the silicone rubber coating the surface of the blanket is very low (10 degrees or less) such as in pad printing, the deformation of the rubber-like elastic material is very large, and the intaglio pattern cannot be reproduced precisely, or if too stiff, the contact between the blanket and ink becomes poor, and pattern cannot be reproduced precisely. The hardness of the elastic material for covering the surface is desired to be 20 degree or more in the JIS rubber hardness, and the rubber hardness in a range of 30 to 60 degrees was found to be appropriate. Meanwhile, if the printing pressure is low (2 kg/cm$^2$ or less), the amount of transfer of ink to the blanket is less, or if the printing pressure is high (6 kg/cm$^2$ or more), the deformation of the rubber-like elastic material increases, and the intaglio pattern cannot be reproduced precisely. An appropriate printing pressure was in a range of 2 to 6 kg/cm$^2$.

EXAMPLE 2

Using a three-roll ceramic mill, a copper ink was prepared by passing the mill base of the following composition six time.

| | |
|---|---|
| Copper (mean particle size 2.0 μm) | 79 (parts by weight) |
| Glass frit (Nippon Electric Glass Co. GA-9) ($PbO.B_2O_3.SiO_2$) | 3 |
| Zinc oxide (Kanto Chemical Co.) | 1 |
| i-BMA, α-MeSt. MMA resin (Sekisui Chemical Inc. IBS-3) Weight-average molecular weight 87340 | 7.5 |
| Solvent (Kanto Chemical Co., butylcarbitol acetate) | 9.1 |
| Dispersing agent (phosphate of polyoxyethylene alkyl or alkylallyl) | 0.4 |

Using the same intaglio as in Example 1, a copper fine pattern was printed on a alumina substrate by the same gravure offset method as in Example 1. The printed pattern was excellent in both linearity and film thickness precision. In succession, the copper thick film pattern printed on the circuit board was dried for 10 minutes at 100° to 150° C., and the solvent contained in the thick film composition was evaporated and removed. Further using nitrogen, in the nonoxidizing atmosphere in which the oxygen concentration was 10 ppm or less so that the copper would not be oxidized, the organic binder was completely baked in an electric furnace controlling the temperature of the high temperature holding part at 920° C. The baking condition was programmed so that the required time in the highest temperature part would be 10 minutes and that the total firing time would be 60 minutes. As a result, the organic polymer contained in order to maintain a proper printability was decomposed along with the temperature rise, and a copper thick film pattern excellent in edge linearity and less in lack of hiding or cutoff was obtained. Also capable of withstanding the peeling test, a sheet resistance of 8 to 15 mΩ/□ was obtained.

Figure 4:
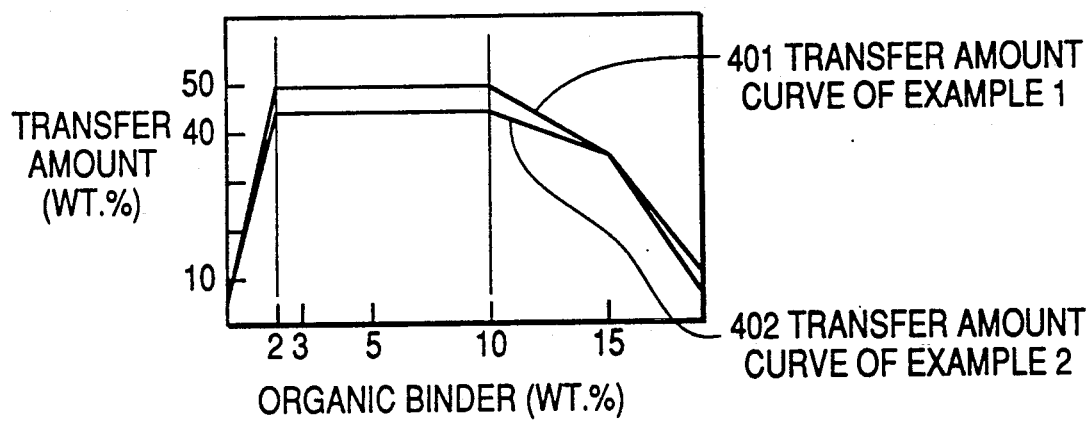
FIG. 4 is a graph showing the transfer amount curve of copper ink to transfer object, as well as organic binder weight percentage to the whole ink amount in Embodiment 1 and Embodiment 2.

FIG. 4 shows the weight percentage of the organic binder to the whole ink volume by varying the content of the organic binder in the copper ink used in Examples 1 and 2, and the transfer amount curve of the copper ink on the transfer surface (the ratio by weight of the ink transferred on the blanket to the ink filling the grooves of the intaglio), respectively 401 and 402. At this time, the large transfer amount region is the range in which the the organic binder weight percentage is 2 to 15 wt. %, and the region of the greatest transfer amount was in the range of the organic binder weight percentage of 2 to 10 wt. %.

Figure 5:
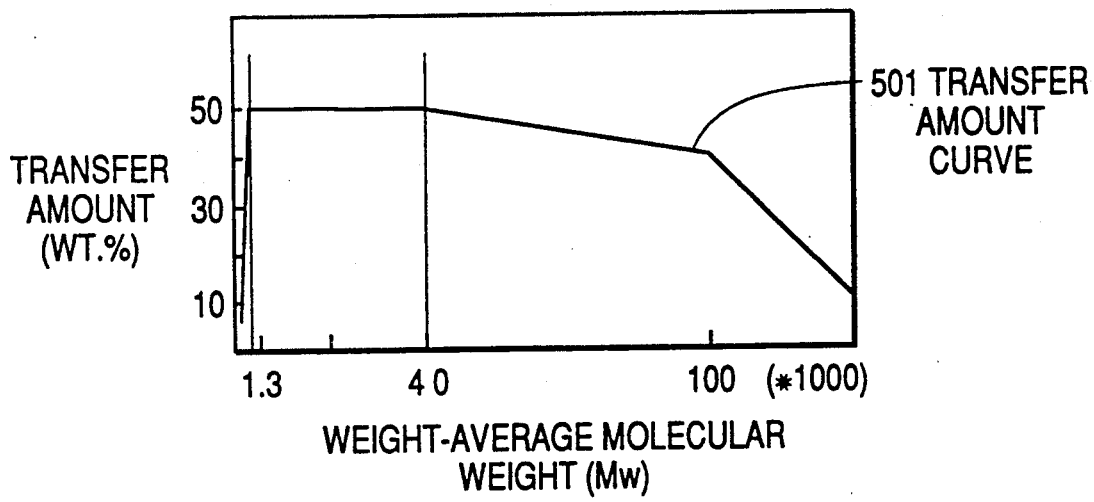
FIG. 5 is a graph showing the weight-average molecular amount of organic binder and transfer amount curve of copper ink on transfer surface.

FIG. 5 is a graph showing the weight-average molecular weight of the organic binder and the transfer amount curve of copper ink of the transfer surface (the ratio by weight of the ink transferred on the blanket to the ink filling the grooves of the intaglio) 301. At this time, the region of the large transfer amount is in a range of the weight-average molecular weight of the organic binder of 1,300 to 100,000, and the region of the greatest transfer amount was in a range of the weight-average molecular weight of the organic binder of 1,300 to 40,000.

Only the result of the copper conductive metal powder is shown in t he graphs, but the results were same in other conductive metal powers.

EXAMPLE 3

Using a three-roll ceramic mill, a gold ink was prepared by passing the mill base of the following composition six times.

| | |
|---|---|
| Gold (mean particle size 1.0 μm) | 79 (parts by weight) |
| Glass frit (Nippon Electric Glass Co. GA-9) ($PbO.B_2O_3.SiO_2$) | 3 |
| Zinc oxide (Kanto Chemical Co.) | 1 |
| i-PMA, α-MeSt resin (Sekisui Chemical Inc. B-12) Weight-average molecular weight 1306 | 9 |
| Solvent (Kanto Chemical Co., butylcarbitol acetate) | 7.6 |
| Dispersing agent (phosphate of polyoxyethylene alkyl or alkylallyl) | 0.4 |

Using the obtained gold ink, in the same intaglio as in Example 1, a pattern of width of 85, 60, 42, 34, 18 μm and height of 14 μm was printed on an alumina substrate by the same gravure offset method as in Example 1. The obtained pattern was excellent in linearity, and of high quality being free from lack of hiding, cutoff or the like. Besides, in the same nonoxidizing atmosphere and baking condition as in Example 2, a gold thick film pattern was obtained. It also withstood peeling taste, and the sheet resistance was 11 to 21 mΩ/□.

EXAMPLE 4

Using the same intaglio as in Example 1 and the same gold ink as in Example 3, a gold fine pattern was printed on an alumina substrate in the same gravure offset method as in Example 1. The printed pattern was excellent in both linearity and film thickness precision. In succession, the gold thick film pattern printed on the circuit board was dried for 10 minutes at 100° to 150° C. and the solvent contained in the thick film composition was evaporated and removed. Furthermore, in an oxidizing atmosphere, the material was fired in an electric furnace controlling the high temperature holding part temperature at 850° C. The firing condition was programmed so that the required time for the highest temperature part would be 10 minutes and that the total firing time would be 60 minutes. As a result, the organic polymer contained in order to keep a proper printability was decomposed along with the temperature rise, and a gold thick film pattern excellent in linearity of edge and less in occurrence of lack of hiding and cutoff was obtained. It also withstood the peeling test, and the same sheet resistance of about 13 to 22 mΩ/□ as in firing in nonoxidizing atmosphere and obtained.

EXAMPLE 5

Using a three-roll ceramic mill, a silver ink was prepared by passing the mill base of the following composition six times.

| | |
|---|---|
| Silver (mean particle size 2.0 μm) | 79 (parts by weight) |
| Glass frit (Nippon Electric Glass Co. GA-9) ($PbO.B_2O_3.SiO_2$) | 3 |
| Zinc oxide (Kanto Chemical Co.) | 1 |
| i-BMA, α-MeSt, MMA resin (Sekisui Chemical Inc. IBM7L-3) Weight-average molecular weght 32060 | 10 |
| Solvent (Kanto Chemical Co., butylcarbitol acetate) | 6.6 |
| Dispersing agent (phosphate of polyoxyethylene alkyl or alkylallyl) | 0.4 |

Using the same intaglio as in Example 1, a silver fine pattern was printed on an alumina substrate in a width of 85, 60, 42, 34, 18 μm and height of 3 μm, by the same gravure offset method as in Example 1. The printed pattern was superior in both linearity and film thickness precision. In succesion, the silver thickn film pattern printed on the substrate was sintering in the same non-oxidizing atmospheric condition as in Example 2. As a result, the organic polymer contained in order to maintain a proper printability was decomposed along with the temperature raise, and a silver thick film pattern excellent in edge linearity and less in occurrence of lack of hiding or cutoff was obtained. It also withstood peeling test, and the sheet resistance was 7.5 to 14.5 mΩ/□.

EXAMPLE 6

Using the same intaglio as in Example 1, same silver ink as in Example 5, and by the same gravure offset method as in Example 1, a silver fine pattern was printed on an alumina substrate. It was further dried and fired in the same condition as in Example 4.

As a result, the organic polymer contained in order to maintain a proper printability was decomposed along with the temperature rise, and a silver thick film pattern excellent in edge linearity and less in occurrence of lack of hiding of cutoff was obtained. It also withstood the peeling test, and the sheet resistance was 10 to 16 m Ω/□ same as when fired in the nonoxidizing atmosphere.

EXAMPLE 7

Using a three-roll ceramic mill, the mill base of the following composition was passed six times, and a copper ink was prepared.

| | |
|---|---|
| Copper (mean particle size 0.05 μm) | 79 (parts by weight) |
| Glass frit (Nippon Electric Glass Co. GA-9) ($PbO \cdot B_2O_3 \cdot SiO_2$) | 3 |
| Zinc oxide (Kanto Chemical Co.) | 1 |
| i-BMA, α-MeSt resin (Sekisui Chemical Inc. IBS-6) Weight-average molecular weight 4750 | 8 |
| Solvent (Kanto Chemical Co., butylcarbitol acetate) | 8.6 |
| Dispersing agent (phosphate of polyoxyethylene alkyl or alkylallyl) | 0.4 |

Using the same intaglio as in Example 1 and by the same gravure off method as in Example 1, a copper fine pattern was printed on an aluminum substrate. In succession, it was fired in the same condition as in Example 2. As a result, a copper thick film pattern excellent in edge linearity and less in occurrence of lack of hiding and cutoff was obtained. It also withstood the peeling test, and the sheet resistance of 6 to 13 mΩ/□. Using powder of small mean particle size, the sheet resistance decreased. In Example 7, and example of copper powder was presented, and there is no problem in gold, silver powder or mixture.

As the resin, meanwhile, a copolymer of poly-iso-butyl methacrylate (i-BMA) and poly-α-methyl styrene (α-MeSt) was used in Examples 1 and 7, a copolymer of poly-iso-butyl methacrylate (i-BMA), poly-α-methylstyrene (α-MeSt) and polymethyl methacrylate (MMA) in Examples 2, 5, 6, and a copolymer of poly-iso-propyl methacrylate (i-PMA) and polyα-methyl styrene (α-MeSt) in Examples 3, 4, but each compound may be used alone or copolymers may be used in mixture.

It is also possible to use poly-iso-propyl methacrylate (i-PMA), polytetrafluoroethylene, or copolymer of poly-iso-propyl methacrylate (i-PMA), poly-α-methyl styrene (α-MeSt) and polymethyl methacryate (MMA). It is of course necessary to determine combination in consideration of the miscibility of resins and dissolution amount in solvent. However, ordinary acrylic resins (such as poly-n-butyl methacrylate) were poor in scattering performance and could not be used. Furthermore in order to improve the dispersion of pigment, it is possible to copolymerize glycidyl methacrylate or the like within 5%. It is any way required to contain at least 5 to 20 wt. % of α-methyl styrene in the resin, and in the exceeding range or if only acrylic resin is used, the resin scattering performance is poor, and the sheet resistance of the formed conductive thick film pattern was high. When using polymethyl methacrylate as acrylic resin, it is desired to add by 20 to 25 wt. %. In the exceeding range, the ink printability is poor and the resin scattering performance is not enough. In addition, if the mean molecular weight of the resin is over 100,000, the ink viscosity is high, which is not suited to printing, or if less than 1,300, the scattering performance is worsened when firing. That is, the mean molecular weight of the resin is preferably 100,000 to 1,300, and most preferably 40,000 to 1,300 as shown in FIG. 5. If the content of the resin is over 15 wt. % of the whole ink amount, the ink viscosity is too high to be suited to printing. That is, the content of the resin is preferably 2 to 15 wt. % to the whole ink amount, and most preferably 2 to 10 wt. % as shown in FIG. 4.

As the conductive metal powder, copper was used in Examples 1, 2, 7, gold in Examples 3, 4, and silver in Examples 5, 6, but these are not limitative, and for example copper powder can be used in Examples 3, 5, gold powder in Examples 1, 2, 5, 6, 7, or silver powder in Examples 1, 2, 3, 4, 7, or conductive metal powers may be mixed.

The content of such conductive metal powders should be preferably 78 to 86 wt. % to the whole ink amount. If smaller than this range, the thick film after baking is not dense enough. If larger than this range the ink viscosity is higher, which is not suited to printing. The mean particle size of conductive metal powder is desired to be 0.05 to 3.0 μm. If the mean particle size is smaller than 0.05 μm, the surface area of the entire particles becomes large, and the content of the vehicle in the ink must be increased, and therefore the content of the conductive metal is lowered. If larger than 3.0 μm, firing is not dense and the sheet resistance becomes larger.

As the organic solvent for composing the vehicle, butyl carbitol acetate was used in Examples 1, 2, 3, 4, 5, 6, 7, but this is not limitative, and α-terpineol, butyl carbitol, 2,2,4-trimethyl 1-3-hydroxypentyl isobutylate, 2-butoxy ethanol, or 2-ethoxy ethanol may be used either alone or in mixture, which may be adjusted to the printing condition or drying condition.

As the transition metal oxide, in Examples 1, 2, 3, 4, 5, 6, 7, zinc oxide was used, but this is not limitative, and titanium oxide, chromium (III) oxide, cadmium oxide, or nickel (II) oxide may be used either alone or in mixture, which may be adjusted to the printing condition or drying condition. If the content of the transition metal oxide is less than 0.5 wt. % of the whole ink amount, the adhesive strength of the fired thick film to the substrate is low, and it was peeled off by applying only a slight external force. The preferable content to the whole ink amount is 0.5 to 2.0 wt. %, and at this time the adhesive strength was enough to withstand the peeling test satisfactory.

The glass frit amount to the whole ink amount is preferably 3 to 4 wt. %. If less than 3 wt. %, the adhesive strength of the fired thick film to the substrate is low, and it was peeled off by applying only a slight external force.

If the content of the dispersing agent to the whole ink amount was less than 0.05 wt. %, the dispersion of ink was poor and the storage stability was insufficient, but if over 5.0 wt. %, the remaining amount of the fired thick film in the pattern was much, and the sheet resistance was higher. That is, the content of the dispersing agent to the whole ink amount is preferably within 0.05 to 5.0 wt. %.

Concerning firing in nonoxidizing atmosphere, when the oxygen concentration was more than 10 ppm, the effect of oxygen was great in the process of scattering of the organic matter, and the concentrations of carbon and oxygen in the conductive thick film are of the same level as firing in oxidizing atmosphere, and were slightly higher than the concentrations of carbon and oxygen in the conductive thick film fired in nonoxidizing atmosphere at the oxygen concentration of 10 ppm or less. Therefore, at the oxygen concentration of 10 ppm or more, the sheet resistance was same as the value of firing in oxidizing atmosphere, and was about 2 mΩ/□ higher as compared with the sheet resistance at the concentration of 10 ppm or less. That is, in firing in nonoxidizing atmosphere, the oxygen concentration is desired to be 10 ppm or less. Furthermore, since firing of copper ink is generally conducted in nonoxidizing atmosphere, the silver ink or gold ink of the invention can coexist with the copper ink in nonoxidizing atmosphere.

What is claimed is:

1. A conductive ink comprising 78-86 wt % of powder of at least one conductive metal selected from the group consisting of copper, gold and silver; 3-4 wt % of glass frit; 0.5-2.0 wt % of at least one transition metal oxide selected from the group consisting of zinc oxide, titanium oxide, chromium (III) oxide, cadmium oxide and nickel (II) oxide; 0.05-5.0 wt % of a dispersing agent comprising a phosphate of polyoxyethylene alkyl or a phosphate of polyoxyethylene alkylallyl; and a vehicle comprising 3-13 wt % of an organic solvent, and 2-15 wt % of an organic binder selected from the group consisting of a copolymer of poly-a-methylstyrene and polyisobutyl methacrylate, a copolymer of poly-α-methylstyrene, polyisopropyl methacrylate and polymethylmetahacrylate, a copolymer of poly-a-methylstyrene and polyisopropyl methacrylate and a copolymer of poly-a-methylstyrene, polyisobutyl methacrylate and polymethyl methacrylate, wherein the average molecular weight of the organic binder is 1,300 to 100,000.

2. A conductive ink according to claim 1, wherein said organic binder is a copolymer of 5-20 wt % of poly-a-methylstyrene and 80-95 wt % of polyisobutyl methacrylate.

3. A conductive ink according to claim 1, wherein said organic binder is a copolymer of 5-20 wt % of poly-a-methylstyrene, 60-90 wt % of polyisopropyl methacrylate and 20-25 wt % of polymethylmethacrylate.

4. A conductive ink according to claim 1, wherein said organic binder is a copolymer of 5-20 wt % of poly-a-methylstyrene and 80-95 wt % of polyisopropyl methacrylate.

5. A conductive ink according to claim 1, wherein said organic binder is a copolymer of 5-20 wt % of poly-a-methylstyrene, 60-90 wt % of polyisobutyl methacrylate and 20-25 wt % of polymethylmethacrylate.

6. A conductive ink according to claim 1, wherein the weight ratio of said organic solvent with respect to the amount of said conductive metal powder, said glass frit and said transition metal oxide is in the range from 0.04 to 0.18.

7. A conductive ink according to claim 1, wherein said conductive metal powder has an average particle diameter in the range from 0.05 to 3.0 μm.

8. A conductive ink according to claim 1, wherein said organic solvent comprises at least one member selected from the group consisting of a-terpineol, butylcarbitol, butylcarbitol acetate, 2,2,4-trimethyl 1-3-hydroxypentyl isobutylate, 2-butoxyethanol and 2-ethoxyethanol.

* * * * *